United States Patent [19]

Ito et al.

[11] Patent Number: 5,081,442

[45] Date of Patent: Jan. 14, 1992

[54] FAULT DETECTOR FOR AN AIR BAG SYSTEM

[75] Inventors: Hisatsugu Ito; Takashi Furui, both of Sanda, Japan

[73] Assignee: Mitsubishi Denki Kabushiki Kaisha, Tokyo, Japan

[21] Appl. No.: 584,961

[22] Filed: Sep. 19, 1990

[30] Foreign Application Priority Data

Dec. 20, 1989 [JP] Japan .................... 1-328362

[51] Int. Cl.$^5$ .................... B60Q 1/00; B60R 21/32
[52] U.S. Cl. .................... 340/438; 280/738; 280/734
[58] Field of Search ............ 340/438, 439, 500, 425.5; 280/734, 735; 180/271; 307/9.1, 10.1

[56] References Cited

U.S. PATENT DOCUMENTS 4,945,336  7/1990  Itoh et al. .................... 340/438
4,956,631  9/1990  Itoh .................... 340/438

FOREIGN PATENT DOCUMENTS 61-57219  12/1986  Japan .

Primary Examiner—Donnie L. Crosland

Attorney, Agent, or Firm—Burns, Doane, Swecker & Mathis

[57] ABSTRACT

A fault of a trigger resistor or a squib resistor of an air bag system is monitored together with other resistors by utilizing a balanced Wheatstone bridge for providing an inexpensive and highly reliable fault detector, wherein first and second junctions of the Wheatstone bridge are connected alternately to a dc amplifier circuit with use of first and second switching circuits for applying a voltage across the squib resistor and a reference voltage alternately on an input terminal of the dc amplifier circuit, amplified voltages are fed from the dc amplifier circuit to a decision circuit to check whether or not the voltage across the squib resistor is within an allowable limit from the reference voltage, the amplified reference voltage is fed from the dc amplifier circuit to a voltage regulating circuit, which has a feedback circuit to the dc amplifier circuit, with use of a third switching circuit for adjusting an output of the voltage regulator to the center value of the input voltage range of the decision circuit, and thereby making it possible to measure a voltage difference at the first and second junctions without being influenced by a fluctuation of the supply voltage or a change of resistance ratio of acceleration sensors.

11 Claims, 7 Drawing Sheets

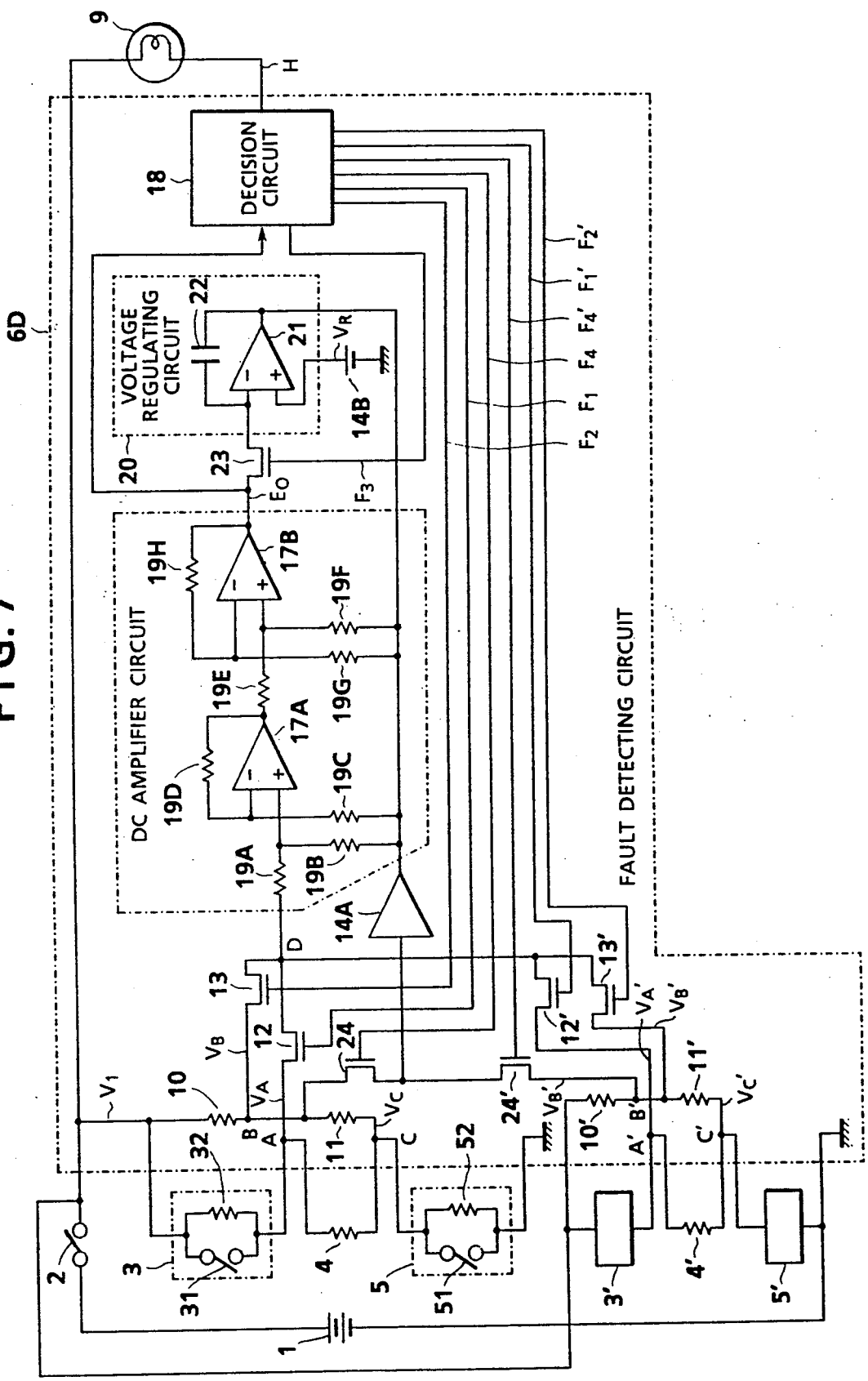

FAULT DETECTOR FOR AN AIR BAG SYSTEM

BACKGROUND OF THE INVENTION

1. Field of the Invention

The present invention relates to a fault detector for a vehicle safety system and more particularly to an inexpensive and highly reliable fault detector for a trigger resistor used in an air bag system.

2. Description of the Prior Art

A common air bag for a vehicle uses a trigger heater called a "squib", which is a resistor having a relatively small resistance value and enables the air bag to be instantaneously inflated at the moment of vehicle collision. Such a trigger resistor, if failed, would put passengers' lives in danger and therefore is constantly monitored for any anomaly in the resistance.

FIG. 1 shows a circuitry of a conventional fault detector used in a air bag system as disclosed in the Japanese Patent Publication No. Showa 61-57219.

In FIG. 1, element 1 represents a vehicle-mounted battery or a direct current power source, and an ignition switch 2 is connected to the dc power source 1 for starting engine. Element 3 is an acceleration sensor (hereinafter called a G sensor) connected to the dc power source 1 through the ignition switch 2 and consists of a normally open contact 31 and a resistor 32 connected in parallel with each other. Element 4 is an air bag activating squib or resistor to be monitored. The squib resistor 4 is connected at a junction A to the G sensor 3. The squib resistor 4 forms a first series circuit along with the resistor 32 of the G sensor 3. Another G sensor 5 is connected at a junction C to the squib resistor 4 and, like the first G sensor 3, consists of a normally open contact 51 and a resistor 52 connected in parallel with each other. The other end of the G sensor 5 is grounded.

Circuit 6 is a fault detecting circuit which is connected across the squib resistor 4 and also to the ends of the G sensors 3 and 5 for detecting a fault of the squib resistor 4. The fault detecting circuit 6 consists of a dc differential amplifier circuit 7 connected to junctions A and C and a comparator circuit 8 connected to an output terminal of the differential amplifier circuit 7. The differential amplifier circuit 7 consists of resistors 71 to 74 that determine an amplification factor and an operational amplifier 75, whereby the resistor 71 is interposed between the junction A and a non-inverted input terminal of the operational amplifier 75, the resistor 72 is between the ground and the non-inverted input terminal of the operational amplifier 75, the resistor 73 is between the junction C and an inverted input terminal of the operational amplifier 75, and the resistor 74 is between an output terminal of the operational amplifier 75 and the inverted input terminal.

The comparator circuit 8 consists of resistors 81 to 83 connected in series for dividing the voltage of the dc power source 1 and thereby providing reference voltages, an operational amplifier 84 a non-inverted input terminal of which is connected to a junction of resistors 81 and 82 whilst an inverted input terminal of which is connected to the output terminal of the operational amplifier 75, an operational amplifier 85 an inverted input terminal of which is connected to a junction of resistors 82 and 83 whilst a non-inverted input terminal of which is connected to the output terminal of the operational amplifier 75, and an AND gate 86 for multiplying the outputs of the operational amplifiers 84 and 85.

Element 9 is an alarm lamp connected to the output terminal of the comparator circuit 8 or to the output terminal of the AND gate 86.

Now, the operation of the prior art fault detector will be described.

When the ignition switch 2 is closed to start a vehicle engine, the G sensors 3 and 5, the squib resistor 4 and the fault detecting circuit 6 are supplied power from the dc power source 1. Since the normally open contacts 31 and 51 are open, a voltage is generated across the squib resistor 4 which is equal to a voltage V1 of the dc source 1 divided by the resistors 32 and 52 and the squib resistor 4.

The resistors 32 and 52 have resistance values R3 and R5 of more than several hundred ohm while the squib resistor 4 has a resistance value R4 of only several ohm. The supply voltage V1 is about 12 V, so the voltage difference $V_{AC}$ between the junctions A and C is several tens of mV. for example, if we assume:

$$R_3 = R_5 = 1k\Omega$$

$$R_4 = 2\Omega$$

then, the voltage $V_{AC}$ across the squib resistor 4 is:

$$V_{AC} = 12 \times 2/(1000 + 1000 + 2)$$
$$\approx 12 \text{ mV}$$

if we suppose the G sensor 3 is short-circuited, we get:

$$V_{AC} = 12 \times 2/(1000 + 2)$$
$$\approx 24 \text{ mV}.$$

if the squib resistor 4 is also short-circuited, we get:

$$V_{AC} = 0V$$

To make it possible to decide whether or not there is any fault according to the voltage which varies in a range of 0–10's mV requires that the resistors 71 to 74 be adjusted so as to set the amplification factor of the differential amplifier 75 to approximately 100. As a result, the output voltage V7 of the differential amplifier circuit 7 is normally 1.2 V, however, in case of a fault, it will be 2.4 V when the G sensor 3 or 5 is short-circuited, while it will be 0 V when the squib resistor 4 is short-circuited.

Hence, the resistors 81 to 83 in the comparator circuit 8 are adjusted in such a way that, outputs of the operational amplifiers 84 and 85 become high "H" levels when the output voltage V7 of the differential amplifier circuit 7 is normal (V7=1.2 V), an output of the operational amplifier 84 becomes low "L" level when the G sensor 3 or 5 is short-circuited (V7=2.4 V), and an output of the operational amplifier 85 becomes low "L" level when the squib resistor 4 is short circuited (V7=0 V).

With this resistor setting, an output of the AND gate 86 goes to a high level in a normal condition for turning the alarm lamp 9 OFF, whilst the output of the AND gate goes to a low level in an abnormal condition for turning the alarm lamp 9 ON, thus alerting the driver to the abnormal condition.

When the G sensors 3 and 5 and the squib resistor 4 are in a normal condition, if a vehicle accident takes place, the normally open contacts 31 and 51 will be closed to heat the squib resistor 4, activating the air bag system to protect the driver from injury.

Since the prior art fault detector, as mentioned above, detects a voltage change resulting from a fault, it is necessary to set the amplification degree of the dc differential amplifier circuit 7 at around 100. This high amplification factor makes the fault detector susceptible to noise. Moreover, with use of dc differential amplification, an error is easily introduced by the influence of the input offset voltage of the amplifier circuit. This requires the use of high-precision amplifying devices as well as fine adjustments in the process of manufacturing, which in turn results in poor reliability and increased production cost.

It is therefore an object of this invention to overcome the aforementioned problems and to provide an inexpensive and highly reliable fault detector for an air bag in a vehicle safety system.

SUMMARY OF THE INVENTION

A fault detector for an air bag system according to this invention comprises a first series circuit consisting of a monitoring resistor and a resistor connected at a first junction to the monitoring resistor, a second series circuit consisting of a pair of resistors connected to each other at a second junction, which second series circuit has the same resistance ratio as that of the first series circuit and is connected in parallel with the first series circuit to form a balanced Wheatstone bridge, a dc power source to supply power for the Wheatstone bridge, first and second switching circuits connected to the first and second junctions respectively for being operated alternately, a dc amplifier circuit connected to a common output terminal of the first and second switching circuits, and a decision circuit to decide whether or not a fault exist in the monitoring resistor based on a difference between output voltages of the dc amplifier circuit, which output voltages are fed alternately to the decision circuit in synchronism with the operation of the first and second switching circuits.

A fault detector for an air bag system according to this invention further comprises a voltage regulating circuit having a feedback circuit to the dc amplifier circuit to adjust an output voltage thereof, and a third switching circuit interposed between the voltage regulating circuit and the dc amplifier circuit for being operated in synchronism with the second switching circuit.

The voltages at the first and second junctions in the balanced Wheatstone bridge are alternately fed to the dc amplifier circuit, and a difference between two output voltages of the dc amplifier circuit is measured for detecting the transistion in a resistance value of the squib resistor. This arrangement prevents the fault detector from being affected by variations in the input offset voltage of the dc amplifier circuit as well as in circuit constants and characteristics of elements of the measuring system. It also eliminates the need for fine adjustment in the process of manufacturing and enables accurate detection of transition in the resistance value of the monitoring resistor.

Moreover, when a voltage at the second junction in the reference side is fed to the dc amplifier circuit by closing the second switching circuit, the third switching circuit is in turn closed to supply the output voltage of the dc amplifier circuit to the voltage regulating circuit in order to adjust it to the center value of the input voltage range of the decision circuit. When the voltage at the first junction in the measuring side is fed to the dc amplifier circuit by closing the first switching circuit, the third switching circuit is opened to disconnect the voltage regulating circuit from the dc amplifier circuit while retaining the feedback voltage of the voltage regulating circuit. As a result, the output voltage of the dc regulating circuit is prevented from being affected by characteristic variations of elements being employed other than the measuring system. This further improves the accuracy in fault detection.

BRIEF DESCRIPTION OF THE DRAWINGS

FIG. 7 is a circuit diagram showing a fourth embodiment of the invention.

DESCRIPTION OF THE PREFERRED EMBODIMENTS

Figure 1:
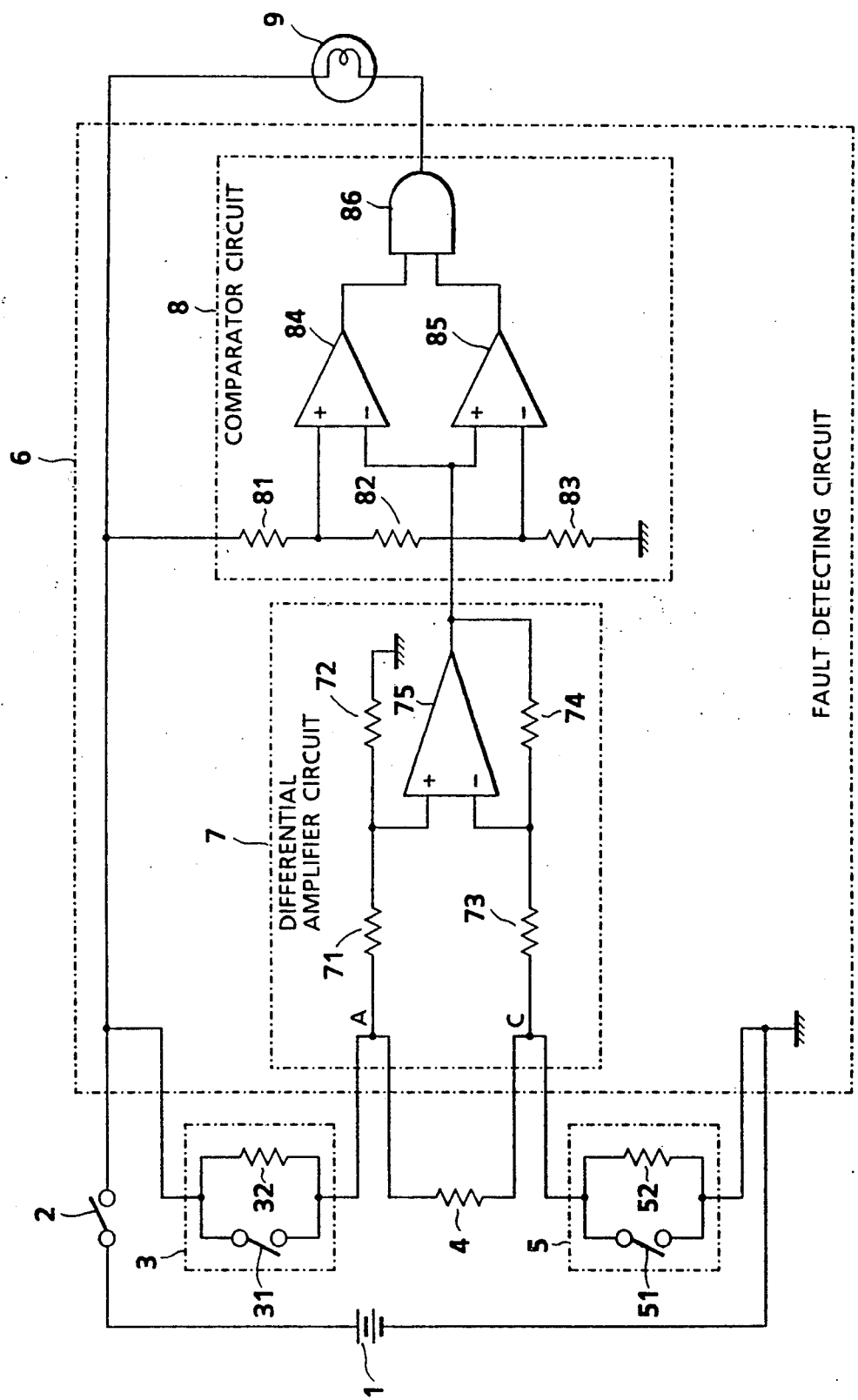
FIG. 1 is a circuit diagram showing a conventional fault detector.
Figure 2:
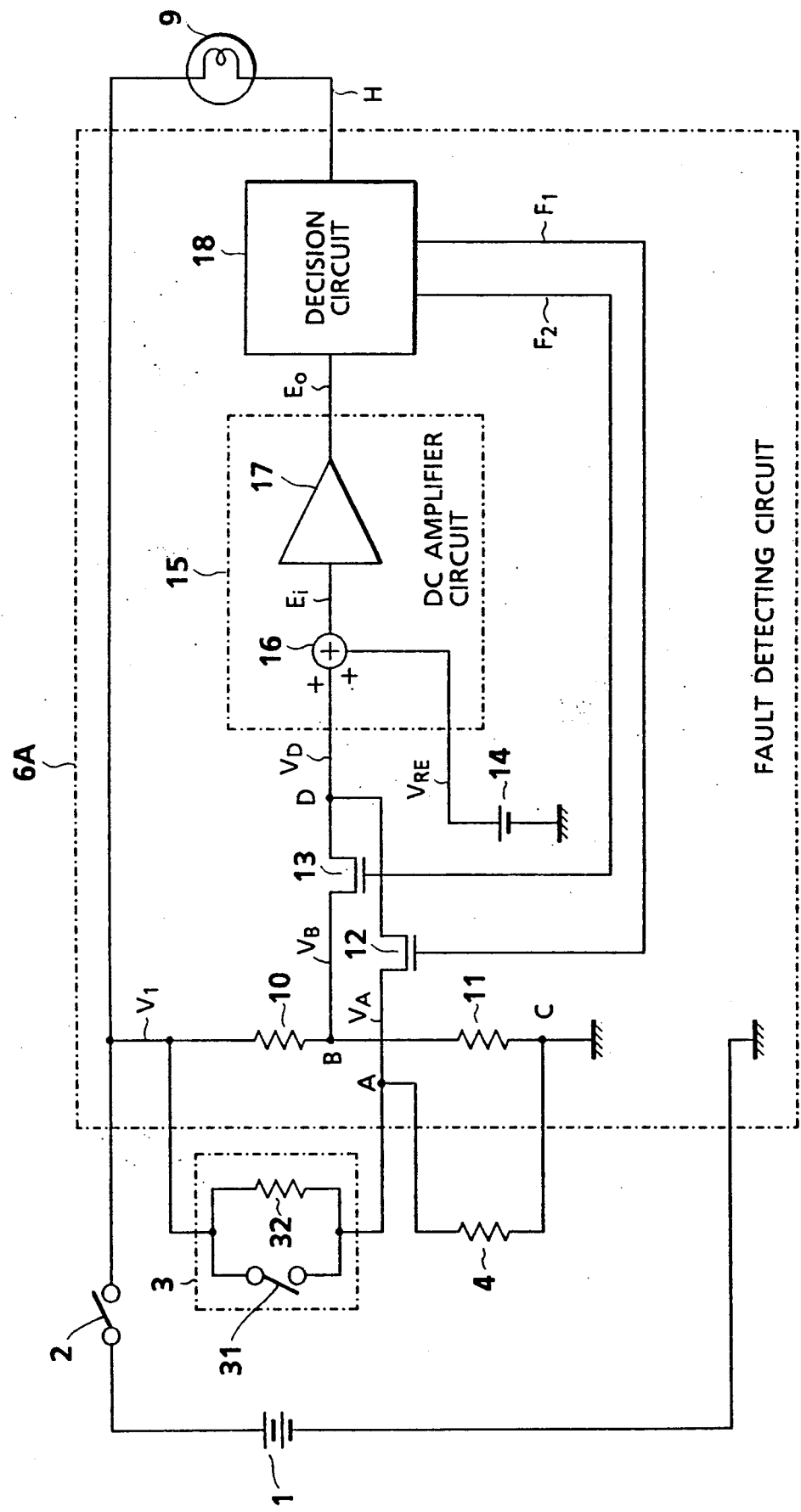
FIG. 2 is a block diagram showing a first embodiment of the invention.

Preferred embodiments of this invention will be described by referring to the accompanying drawings. Referring now to FIG. 2, circuit 6A is a fault detecting circuit that corresponds to the circuit of FIG. 1. Components 1 to 4 and 9 are identical to those designated by like reference numerals in FIG. 1 explained above. The fault detecting circuit 6A consists of elements 10 to 18 which will be shown hereinafter.

Elements 10 and 11 are a pair of resistors connected in series at a junction B to form a second series circuit. Resistance values R10 and R11 of the resistors 10 and 11 are so selected that they have the same resistance ratio as that of a resistor 32 and a squib resistor 4 in a first series circuit. The second series circuit is connected in parallel with the first series circuit to constitute a balanced Wheatstone bridge.

Circuits 12 and 13 are a first and a second switching circuit which are connected to the junctions A and B respectively for alternative switching. These switching circuits are made up of FET transistors. A reference power supply 14 generates a standard reference voltage $V_{RE}$.

A dc amplifier circuit 15 is connected to a common output terminal D of the switching circuits 12 and 13, and consists of an adder 16 for adding the voltage $V_D$ at the common output terminal D to the reference voltage $V_{RE}$ fed from the reference power supply 14, and an amplifier 17 for amplifying an input voltage $E_i$ from the adder 16.

A decision circuit 18 checks the output voltage Eo of the dc amplifier circuit to decide if there is any fault. The decision circuit 18 may be formed, for example, of a microcomputer and provides the switching circuits 12 and 13 with gate control signals F1 and F2. When it decides that there is a fault in the squib resistor 4, the decision circuit 18 produces a drive signal H for turning on the alarm lamp 9.

Next, we will explain the operation of the first embodiment of the invention shown in FIG. 2.

Let $V_1$ stand for the supply voltage and $R_3$, $R_4$, $R_{10}$ and $R_{11}$ for resistances of the resistors 3, 4, 10 and 11 respectively in the Wheatstone bridge. The voltages $V_A$ and $V_B$ at the junctions A and B when the ignition switch 2 is closed are given by:

$$V_A = V_1 R_4/(R_3 + R_4) \tag{1}$$

$$V_B = V_1 R_{11}/(R_{10} + R_{11}) \tag{2}$$

Now, the resistance of the squib resistor 4 in normal condition is taken as $R_4^*$, and the amount of resistance deviation as $\Delta R_4$. When the resistance $R_4$ changes from the normal value $R_4^*$ by the amount $\Delta R_4$, it is expressed as:

$$R_4 = R_4^* + \Delta R_4 \tag{3}$$

In order to keep the Wheatstone bridge in a balancing condition, the resistances $R_{10}$ and $R_{11}$ of the resistors 10 and 11 must be so selected that the resistance ratios of the first and second series circuits are equal when the squib resistor 4 is normal. Under this condition, we obtain the following relationship.

$$R_4^*/R_3 = R_{11}/R_{10} = \alpha \tag{4}$$

where $\alpha$ is a resistance ratio. From equations (1) to (4), the voltages $V_A$ and $V_B$ at the junctions A and B are given by:

$$V_A = [\alpha V_1/(1+\alpha)](1 + \Delta R_4/R_4^*) \tag{5}$$

$$V_B = \alpha V_1/(1+\alpha) \tag{6}$$

It follows from equations (5) and (6) that if $R_4 = R_4^*$, i.e., $\Delta R_4 = 0$, then $V_A = V_B$.

Now, suppose the first switching circuit 12 is turned on (closed) and the second switching circuit 13 turned off (open). We obtain:

$$V_D = V_A$$

The voltage $V_A$ at the junction A is applied to the dc amplifier circuit 15. At this time, if we let the input and output voltages of the amplifier 17 be $Ei_1$ and $Eo_1$ respectively, they can be written as:

$$Ei_1 = V_A + V_{RE}$$

$$Eo_1 = G(V_A + V_{RE}) \tag{7}$$

where G is an amplification factor of the amplifier 17.

Conversely, when the first switching circuit 12 is turned off (open) and the second switching circuit 13 turned on (closed), $$V_D = V_B$$

The voltage $V_B$ at the junction B is now supplied to the dc amplifier circuit 15. If we let the input and output voltages of the amplifier 17 at this moment be $Ei_2$ and $Eo_2$, $$Ei_2 = V_B + V_{RE}$$

$$Eo_2 = G(V_B + V_{RE}) \tag{8}$$

In synchronism with the switching timing, the decision circuit 18 picks up the output voltages $Eo_1$ and $Eo_2$ that are alternately selected by the switching circuits 12 and 13, and calculates the voltage difference $\Delta Eo$ between them. From equations (5) to (8), the voltage difference $\Delta Eo$ is given by:

$$\begin{aligned}\Delta Eo &= Eo_1 - Eo_2 \\ &= \alpha G V_1 \Delta R_4/(1+\alpha)R_4^*\end{aligned} \tag{9}$$

The voltage difference $\Delta Eo$ is proportional to the resistance deviation $\Delta R_4$. If we assume that $R_3 = 1$ k$\Omega$, $R_4^* = 3\Omega$, $R_{10} = 100$ k$\Omega$, $R_{11} = 300\Omega$, $V_1 = 10$ V, $\alpha = 3/1000$, and $G = 100$ and if the resistance deviation is $\Delta R_4 = 1\Omega$, then from equation (9) the voltage difference $\Delta Eo$ is given by:

$$\begin{aligned}\Delta Eo &= 100(3/1000)/3(1 + 3/1000) \\ &\approx 0.997 \text{ V}\end{aligned}$$

This means that a resistance deviation $\Delta R_4$ of 1$\Omega$ in the squib resistor 4 causes a voltage difference $\Delta Eo$ of about 1 V. And from equation (9), when $\Delta R_4 = 0\Omega$, $\Delta Eo = 0$ V. Therefore, a resistance deviation $\Delta R_4$ of 0.1$\Omega$ will produce a voltage difference $\Delta Eo$ of about 0.1 V. This voltage difference is well below a level that can be handled without a problem by ordinary electronic circuits.

The reference power supply 14 supplies the reference voltage $V_{RE}$ to the adder 16 to correct the input voltage Ei to the amplifier 17 so that the output voltage Eo of the dc amplifier circuit 15 falls within a specified voltage range (for instance, 0 to 5 V) wherein a voltage difference can be detected by the decision circuit 18. The decision voltage range varies depending on the semiconductor devices used.

The output voltage $Eo_1$ in the measuring side given by equation (7) changes according to the resistance $R_4$ of the squib resistor 4. When it greatly varies beyond the specified voltage range of 0-5 V, the output voltage value can easily be identified as being abnormal. The other output voltage $Eo_2$ in the reference side given by equation (8), however, must be within the 0-5 V range at all times and this is achieved by the application of the reference voltage $V_{RE}$. If, under the conditions same as above, the amplification factor is taken as $G = 100$ for example, the output voltage $Eo_2$ can be written from equation (8) as follows.

$$Eo_2 = 100(V_B + V_{RE})$$

From equation (1), we obtain:

$$Eo_2 = 100[V_1 R_{11}/(R_{10} + R_{11}) + V_{RE}]$$

The output voltage $Eo_2$ is preferably set at the center of the range of the other output voltage $Eo_1$, i.e., at 2.5 V. The allowable variation range is therefore about $2.5 \pm 1$ V. From the above consideration the following relationship holds.

$$1.5 \leq 100(0.003 V_1 + V_{RE}) \leq 3.5 \tag{10}$$

If the reference voltage $V_{RE}$ is taken as the sum of a fixed voltage $V_{RO}$ and a variable voltage $(=0.003 V_1)$, this is expressed as:

$$V_{RE} = V_{RO} - 0.003 V_1 \quad (11)$$

From equations (10) and (11), the requirement that the fixed voltage $V_{RO}$ must meet is:

$$15 mV \leq V_{RO} \leq 35 mV \quad (12)$$

Rewriting the equation (12) results in:
$$V_{RO} = 25 mV \pm 10 mV$$

It is seen that the reference voltage $V_{RE}$ is well below a level that can be handled without a problem in terms of circuit technology.

Figure 3:
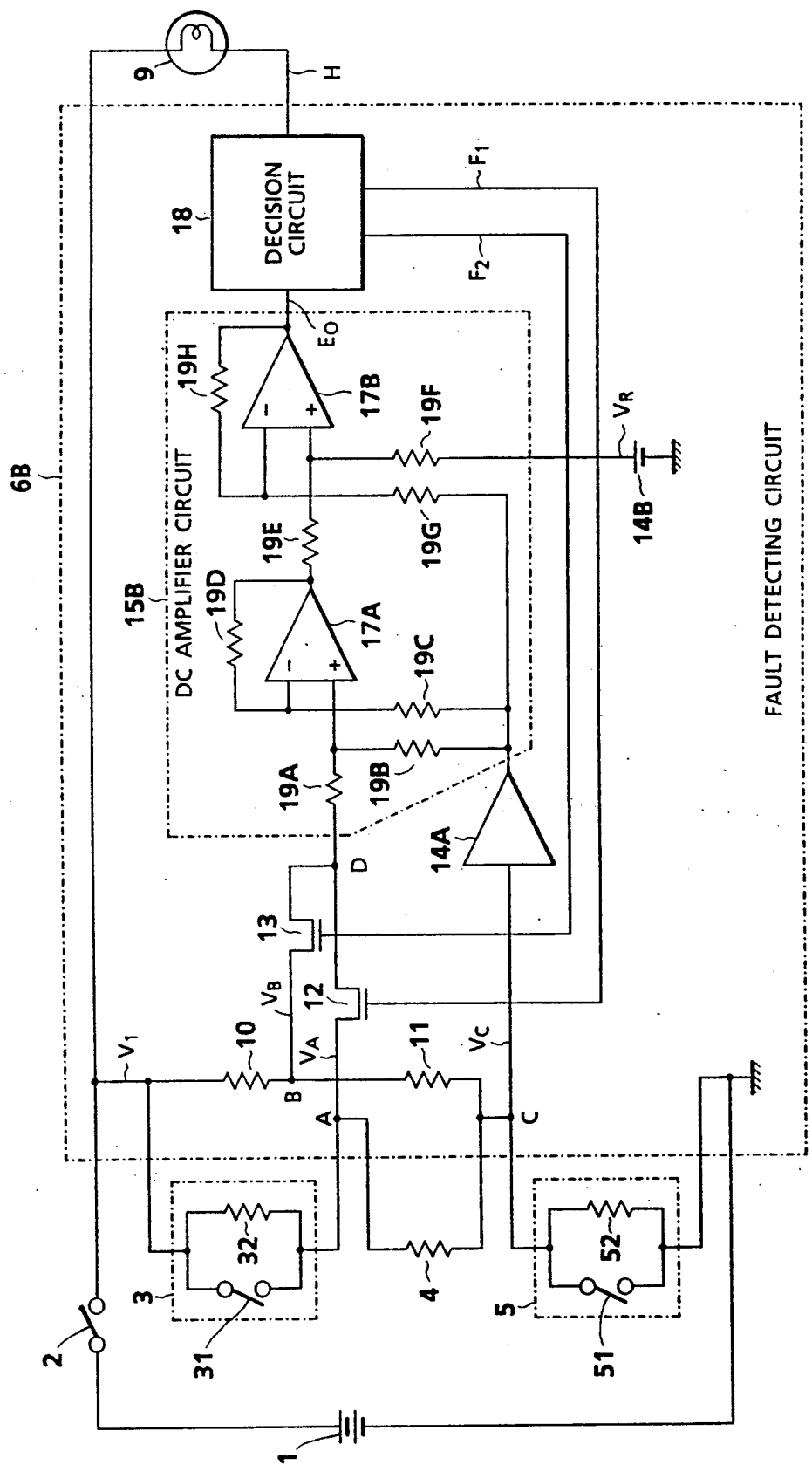
FIG. 3 is a block diagram showing a second embodiment of the invention.

In the above embodiment, while only one G sensor 3 is used, the same effect can be obtained if two G sensors 3 and 5 are employed as in the case of FIG. 3.

FIG. 3 is a circuit diagram showing a second embodiment of this invention. Designated 14A is an amplifier with an amplification factor of unity, which has its input terminal connected to junction C and is designed to give a bias to a dc amplifier circuit 15B. A reference power supply 14B is installed in a fault detecting circuit 6B along with the amplifier 14A and generates a reference voltage $V_R$ to give an appropriate amount of offset to the output voltage Eo of the dc amplifier circuit 15B.

The dc amplifier circuit 15B consists of operational amplifiers 17A and 17B connected in series and resistors 19A to 19H. The resistor 19A is inserted between a common output terminal D and a non-inverted input terminal of the operational amplifier 17A; the resistor 19B is connected between the output terminal of the amplifier 14A and the non-inverted input terminal of the operational amplifier 17A; the resistor 19C is connected between the output terminal of the amplifier 14A and the inverted input terminal of the operational amplifier 17A; the resistor 19D is connected between the output terminal and the inverted input terminal of the operational amplifier 17A; the resistor 19E is inserted between the output terminal of the operational amplifier 17A and a non-inverted input terminal of the operational amplifier 17B; the resistor 19F is inserted between the reference power supply 14B and the non-inverted input terminal of the operational amplifier 17B; the resistor 19G is inserted between the output terminal of the amplifier 14A and the inverted input terminal of the operational amplifier 17B; and the resistor 19H is inserted between the output terminal and the inverted input terminal of the operational amplifier 17B.

Let us denote the resistances of the resistors 19A to 19H by $R_A$ to $R_H$, respectively. Let us also assume that the following relationships hold.

$$R_A = R_C = R_E = R_G = R_S \quad (13)$$

$$R_B = R_D = R_F = R_H = R_P \quad (14)$$

Then, the output voltages $Eo_1$ and $Eo_2$ of the dc amplifier 15B when the switching circuits 12 and 13 are closed are given by:

$$Eo_1 = (V_A - V_C)(R_P/R_S)^2 + V_R + V_{OF} \quad (15)$$

$$Eo_2 = (V_B - V_C)(R_P/R_S)^2 + V_R + V_{OF} \quad (16)$$

where $V_C$ is the voltage at junction C. $V_{OF}$ is an offset input voltage to the operational amplifiers 17A and 17B and includes error components caused by deviations of each resistor 19A to 19H from the values given by equations (13) and (14).

In the equations (15) and (16), $$V_{AC} = V_A - V_C \quad (17)$$
$$= (V_1 - V_C) R_4/(R_3 + R_4)$$

$$V_{BC} = V_B - V_C \quad (18)$$
$$= (V_1 - V_C) R_{11}/(R_{10} + R_{11})$$

These may be rewritten by using the previous equations (3) and (4), that is, $$R_4 = R_4^* + \Delta R_4$$

$$R_4^*/R_3 = R_{11}/R_{10} = \alpha$$

For example, consider a case where there is only a slight variation in the resistance deviation $\Delta R_4$. Because:

$$\Delta R_4 = 0\Omega$$

the equations (17) and (18) can be approximated to the following expressions:

$$V_{AC} = \alpha(V_1 - V_C)(1 + \Delta R_4/R_4^*)/(1 + \alpha) \quad (19)$$

$$V_{BC} = \alpha(V_1 - V_C)/(1 + \alpha) \quad (20)$$

Thus, from the equations (15), (16), (19) and (20), the voltage difference $\Delta Eo$ calculated by the decision circuit 18 may be written as:

$$\Delta Eo = \alpha(V_1 - V_C)(R_P/R_S)^2 \Delta R_4/(1 + \alpha) R_4^* \quad (21)$$

As in the first embodiment, the following assumptions are made: $R_3 = 1$ K$\Omega$, $R_4^* = 3\Omega$, $R_{10} = 100$ K$\Omega$, $R_{11} = 300\Omega$, and $R_P/R_S = 10$. The resistance $R_5$ of the resistor 52 is assumed to be:
$$R_{10} > > R_5 (= R_3) > > R_4$$

Then $$V_1 - V_C = V_1/2$$
$$= 10 V$$

The equation (21) can therefore be rewritten as:

$$\Delta Eo \approx 3\Delta R_4/R_4^*$$
$$= \Delta R_4$$

For the resistance deviation of $\Delta R_4 = 0.1\Omega$, we get the voltage difference of $\Delta Eo = 0.1$ V and, with this embodiment, it is possible to detect a fault in the squib resistor with the same sensitivity as that of the first embodiment.

In this way, the voltage difference $\Delta Eo$ between the output voltage $Eo_2$ associated with the voltage $V_B$ at junction B on the reference side and the output voltage $Eo_1$ associated with the voltage $V_A$ at junction A on the measuring side is used to determine the resistance variation of the squib resistor 4. This method enables precise detection of a fault, not affected by any characteristic variations in the measuring system.

In accordance with this embodiment, however, any change in the supply voltage $V_1$ for other than the measuring system results in a variation in the voltage $V_{BC}(=V_B-V_C)$ on the reference side given by the equation (10). The variation in the voltage $V_{BC}$ on the reference side is also caused by a change in the voltage $V_C$ at junction C, which may occur when the characteristic of the resistor 52 in the G sensor 5 changes. The voltage change in $V_{BC}$ in turn causes the output voltage $E_{o2}$ to deviate from the center value (2.5 V) of the input voltage range (0–5 V) of the decision circuit 18, thus resulting in a possibility of improper measurement of the output voltage $E_{o1}$ associated with the junction A being monitored.

Next, a third embodiment of the invention will be described, in which the output voltage Eo remains stable even when there are variations in the supply voltage $V_1$ for other than the measuring system or in a state of the resistor 52 of the G sensor 5.

Figure 4:
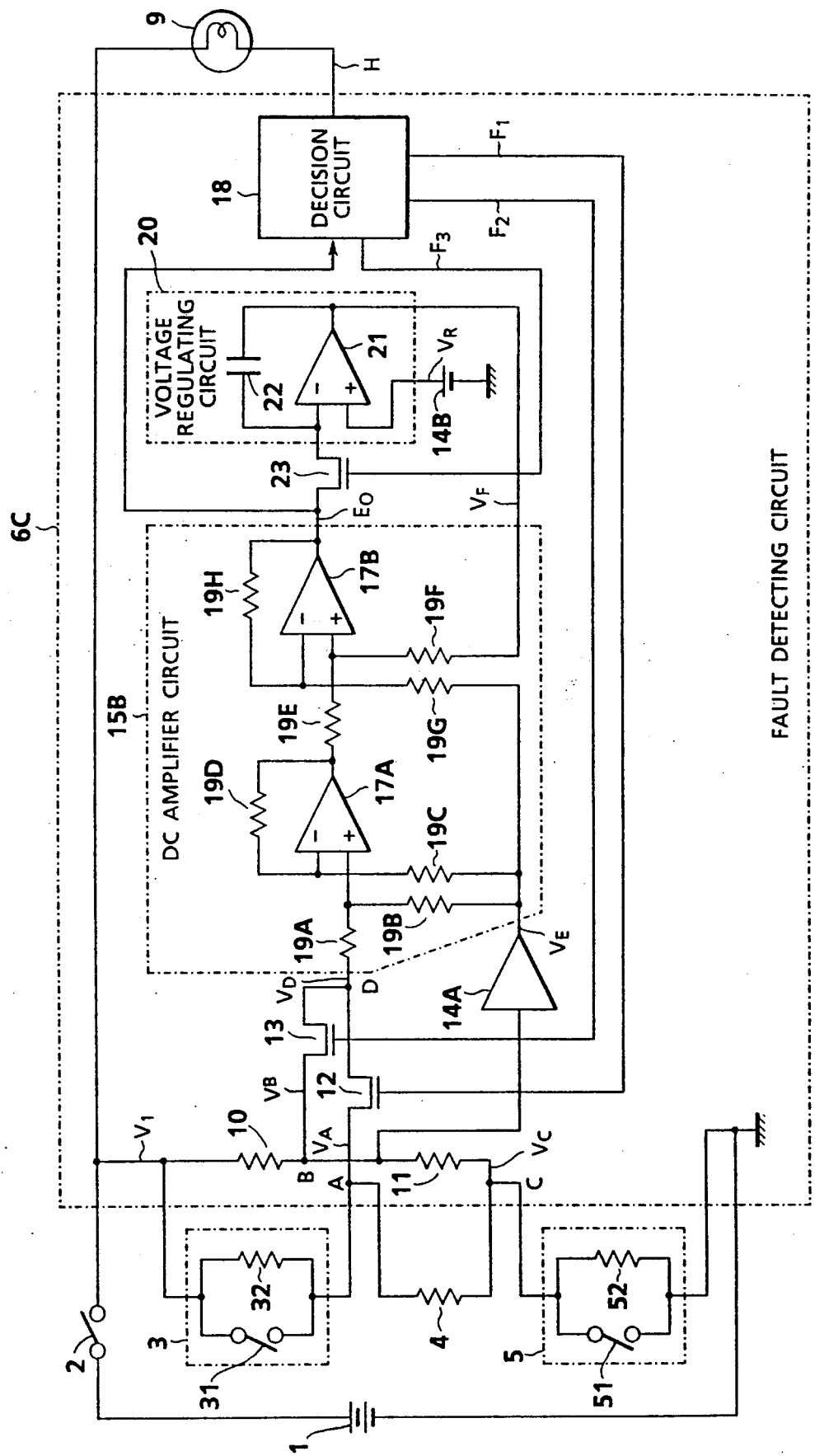
FIG. 4 is a circuit diagram showing a third embodiment of the invention.

FIG. 4 shows a circuit diagram of a third embodiment of the invention. Reference numerals 1 to 18 represent components similar to those of FIG. 3, except that the input terminal of the amplifier 14A is connected to junction B on the reference side.

Circuit 20 is a voltage regulating circuit whose output is fed back to the dc amplifier circuit 15B to regulate the output voltage Eo of the dc amplifier circuit 15B. The voltage regulating circuit 20 consists of an operational amplifier 21 and a capacitor 22 inserted between the input and output terminals of the operational amplifier 21.

Circuit 23 is a third switching circuit inserted between the voltage regulating circuit 20 and the dc amplifier circuit 15B. The third switching circuit 23 is operated in synchronism with the second switching circuit 13 by a control signal $F_3$ from the decision circuit 18.

The output voltage Eo of the dc amplifier circuit 15B is fed to the inverted input terminal (−) of the operational amplifier 21 through the third switching circuit 23. The reference voltage $V_R$ of the reference power supply 14B is applied to the non-inverted input terminal (+) of the operational amplifier 21.

The feedback voltage $V_F$ derived from the operational amplifier 21 in the voltage regulating circuit 20 is applied to its own inverted input terminal (−) through the capacitor 22 and also fed to the non-inverted input terminal (+) of the operational amplifier 17B through the resistor 19F of the dc amplifier circuit 15B.

Figure 5:
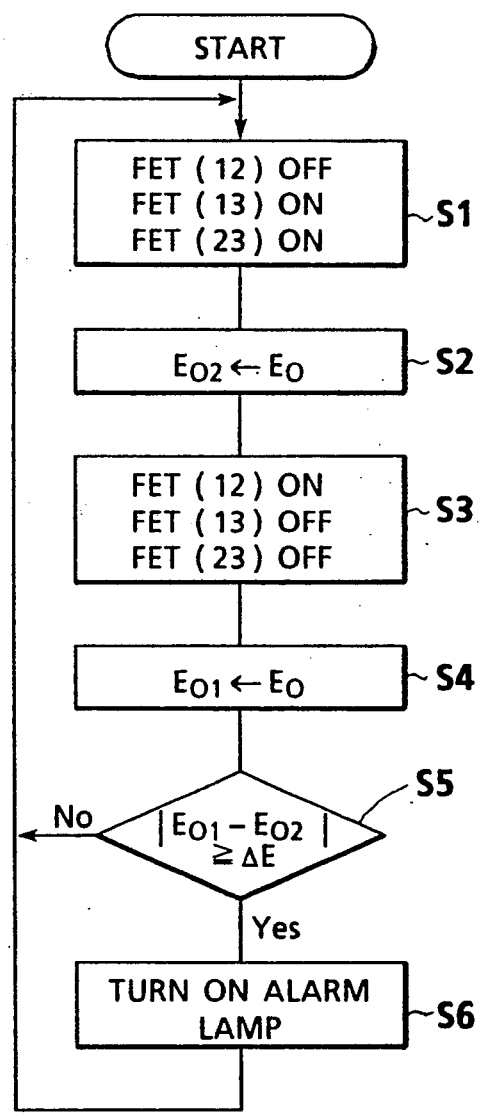
FIG. 5 is a flow chart showing operational steps performed by a decision circuit of FIG. 4.
Figure 6:
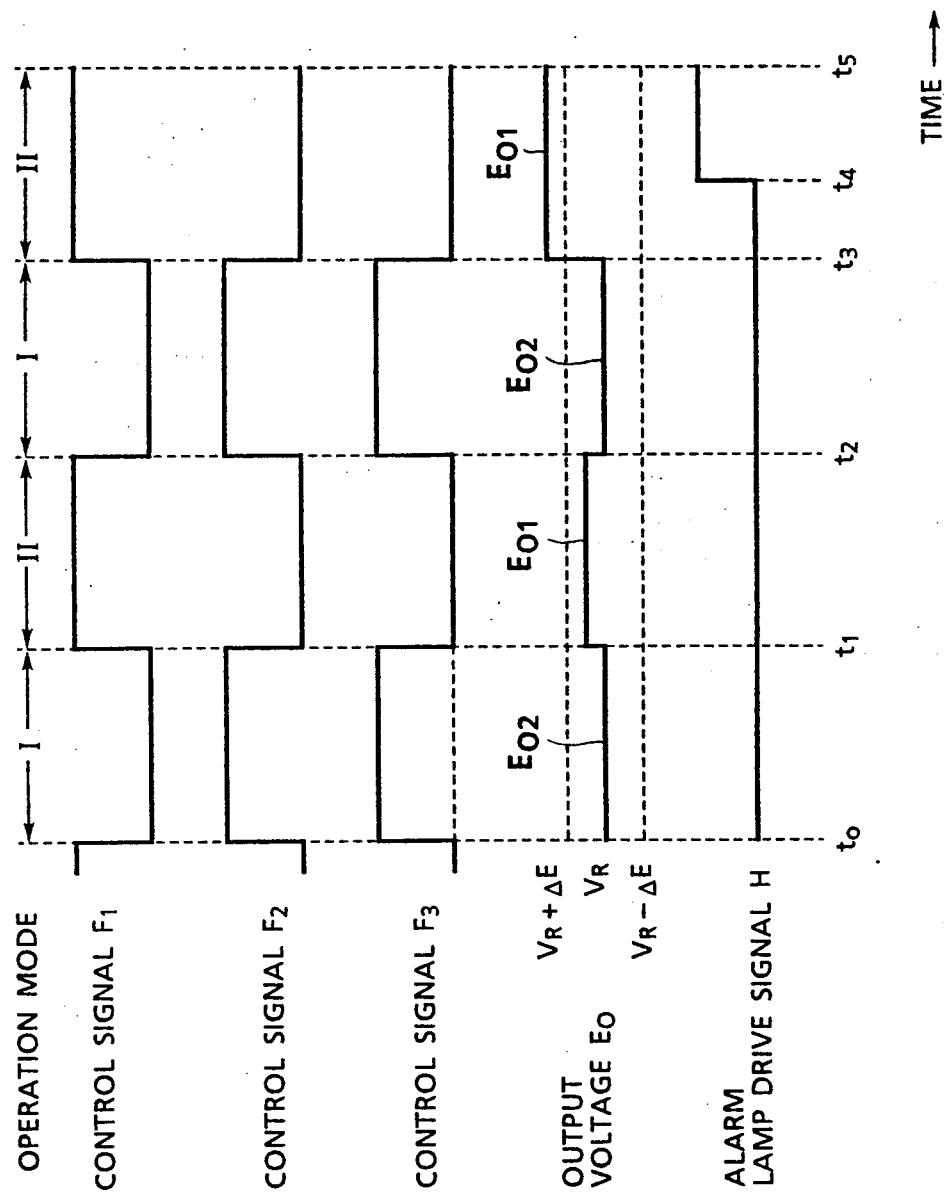
FIG. 6 is a timing diagram showing waveforms for illustrating the operation of the circuit of FIG. 4.

Now, by referring to a flowchart of FIG. 5 and a waveform timing diagram of FIG. 6, we will explain about the operation of the third embodiment introduced in FIG. 4.

Voltages supplied to the dc amplifier circuit 15B are the voltage $V_D$ at junction D and the output voltage $V_E(=V_B)$ of the buffer amplifier 14A. Thus, the output voltage Eo from the dc amplifier circuit 15B is expressed as:

$$Eo = R_B/(R_A+R_B)\{(R_C+R_D)/R_C\}\{R_F/(R_E+R_F)\} \times \{(R_G+R_H)/R_G\}(V_D-V_E) + \{(R_FR_G-R_ER_H)/R_G(R_E+R_F)\}V_E + \{R_C/(R_C+R_D)\}\{(R_E+R_F)/R_E\}V_F+V_{OF} \quad (22)$$

Since the resistances $R_A$ to $R_H$ satisfy the equations (13) and (14), the equation (22) can be rewritten as:

$$Eo=(R_P/R_S)^2(V_D-V_E)+V_F+V_{OF} \quad (23)$$

As shown in FIG. 6, the decision circuit 18 outputs control signals $F_1$ to $F_3$ and the switching circuits 12, 13 and 23 are controlled to enter one of the following two operation modes:

(I) Reference voltage ($E_{o2}$) mode First switching circuit 12 is turned off, and Second and third switching circuits 13 and 23 are turned on.

(II) Measuring voltage ($E_{o1}$) mode First switching circuit 12 is turned on, and Second and third switching circuits 13 and 23 are turned off.

In a time duration from $t_0$ to $t_1$, as the control signal $F_1$ goes low and the control signals $F_2$ and $F_3$ go high, the first switching circuit 12 turns off and the second and third switching circuits 13 and 23 turn on (at step S1 in FIG. 5).

The operation mode at this time is a reference voltage mode (I), so that the output voltage Eo assumes the value of $E_{o2}$ associated with the junction B on the reference side (step S2).

Since the second switching circuit 13 is closed, $$V_D=V_E=V_B$$

From the equation (23), the output voltage $E_{o2}$ is given by:

$$E_{o2}=V_F+V_{OF} \quad (24)$$

The closing of the third switching circuit 23 allows the output voltage $E_{o2}$ to be applied to the voltage regulating circuit 20. The operational amplifier 21 now adjusts the feedback voltage $V_F$ so that the equation (24) satisfies the following relationship:

$$V_F+V_{OF}=V_R$$

With the feedback voltage $V_F$ adjusted in this way, the output voltage $E_{o2}$ is set accurately to the reference voltage $V_R$, which is the center of the input voltage range for the decision circuit 18.

Next, in a time duration from $t_1$ to $t_2$, the control signals $F_1$ to $F_3$ are reversed in polarity to turn on the first switching circuit 12 and turn off the second and third switching circuits 13 and 23 (step S3), changing the operation mode to the measuring voltage mode (II). In the measuring voltage mode, the output voltage Eo assumes the value of $E_{o1}$ associated with the junction A on the measuring side (step S4).

Because the first switching circuit 12 is turned on, $$V_D=V_A$$

$$V_E=V_B$$

From the equation (23), the output voltage $E_{o1}$ becomes:

$$E_{o1}=(R_P/R_S)^2(V_A-V_B)+V_F+V_{OF} \quad (25)$$

At this time the input to the operational amplifier 21 is cut off by the third switching circuit 23 turning off. But the feedback voltage $V_F$ produced during the reference operation mode (I) is retained by the capacitor 22. From the equation (24), it can be expressed as:

$$V_F = E_{o2} - V_{OF} \quad (26)$$
$$= V_R - V_{OF}$$

Thus, using the equations (25) and (26), the output voltage $E_{o1}$ is given by:

$$E_{o1} = (R_P/R_S)^2(V_A - V_B) + V_R \quad (27)$$

The equation (27) indicates that the output voltage $E_{o1}$ during the measuring voltage mode always takes a value which is deviated from the reference voltage $V_R$ by the amplified voltage difference ($V_A - V_B$) between the junctions A and B in the Wheatstone bridge. Therefore, setting the reference voltage $V_R$ at the center value of the input voltage range of the decision circuit 18 makes it possible to measure the voltage difference ($V_A - V_B$) without being influenced by fluctuations either in the supply voltage $V_1$ or in the resistance ratio between the G sensors 3 and 5. This allows the fault detector to detect a change in resistance of the squib resistor 4 in the same way as that shown in FIG. 3.

In other words, it is checked whether the voltage difference $\Delta E_o$ ($= E_{o1} - E_{o2}$) is within a predetermined allowable variation range $\Delta E$ (step S5) and if it exceeds the allowable range, i.e., $$|E_{o1} - E_{o2}| \geq \Delta E$$

a drive signal H is produced by the decision circuit 18 to light the alarm lamp 9 (step S6).

On the other hand, at step S5 if the voltage difference $\Delta E_o$ is found to be within the allowable variation range $\Delta E$, the process returns to step S1 to repeat the same operations.

FIG. 6 shows a case where, in a time span from $t_3$ to $t_5$, the output voltage $E_{o1}$ is found to have a value in excess of the allowable variation range $\Delta E$, causing the drive signal H to go high at time $t_4$ with a certain processing time lag after $t_3$.

While in the preceding embodiments the detection is made of resistance variation only in a single squib resistor 4 for the one-airbag system, it is possible to detect resistance variations in a plurality of squib resistors at the same time.

FIG. 7 is a circuit diagram showing a fourth embodiment of the invention applied to fault detection in a two-airbag system.

A second airbag system consisting of G sensors 3' and 5' and a monitor resistance 4' is installed in parallel with the first airbag system that consists of similar components 3 to 5.

Among the components that are newly accommodated in the fault detecting circuit 6D are: resistors 10' and 11' that, together with the resistor in the G sensor 3' and the squib resistor 4', form a second Wheatstone bridge; first and second switching circuits 12' and 13' associated with the second Wheatstone bridge; and fourth switching circuits 24 and 24' for selectively connecting either a junction B of the first Wheatstone bridge or a junction B' of the second Wheatstone bridge to the amplifier 14A.

The decision circuit 18 therefore sends control signals $F_1$ to $F_4$, $F_1'$, $F_2'$ and $F_4'$ to the associated switching circuits to put the two Wheatstone bridges in one of two operation modes, one bridge at a time.

In other words, when the squib resistor 4 is to be checked, the fourth switching circuit 24 is operated by turning on the control signal $F_4$ and turning off the control signals $F_1'$, $F_2'$ and $F_4'$ to select the first Wheatstone bridge. At the same time, the control signals $F_1$ to $F_3$ switch the operation mode between (I) and (II) as shown in FIG. 6.

Likewise, when the other squib resistor 4' is to be checked, the fourth switching circuit 24' is activated by turning on the control signal $F_4'$ and turning off the control signals $F_1$, $F_2$ and $F_4$ to select the second Wheatstone bridge. The control signals $F_1'$ $F_2'$ and $F_3$ act the same way as $F_1$ to $F_3$ to switch the operation mode between the two modes (I') and (II').

Whichever Wheatstone bridge is selected, the reference voltage mode (I) or (I') produces the output voltage $E_{o2}$ associated with the junction B or B' and the measuring voltage mode (II) or (II') provides the output voltage $E_{o1}$ associated with the junction A or A'.

Even when the resistance ratio of the G sensors 3 and 5, or resistors 32 and 52, differs from that of G sensors 3' and 5' and that voltages at the both ends, or junctions A and B, of the first Wheatstone bridge differs from voltages at the both ends, or junctions A' and B', of the second Wheatstone bridge, there will be caused no problem because the output voltage $E_{o1}$ may vary from the reference voltage VR as making it the center of the variation.

While in the preceding embodiments the control signals for operating the switching circuits are generated by the decision circuit 18, they may be formed by a separate timing circuit (not shown).

Although the squib resistor 4 is shown applied as the trigger heater in automotive airbag systems, it can also be used for other types of resistor having comparatively small resistance and still provide the similar effect.

The invention may be summarized as follows. The fault detector according to the invention comprises a first series circuit consisting of a monitoring resistor and a resistor connected at a first junction to the monitoring resistor, a second series circuit consisting of a pair of resistors connected to each other at a second junction, the second series circuit has the same resistance ratio as that of the first series circuit and connected in parallel with the first series circuit to form a balanced Wheatstone bridge, a dc power source to supply the Wheatstone bridge, first and second switching circuits connected to the first and second junctions respectively for being alternately operated, a dc amplifier circuit connected to a common output terminal of the two switching circuits, and a decision circuit to decide whether or not a fault exists in the monitoring resistor according to the difference between output voltages of the dc amplifier circuit, the output voltages of the dc amplifier circuit being picked up alternately by the decision circuit in synchronism with the operation of the first and second switching circuits.

Because of this arrangement, the fault detector is not affected by variations in the offset input voltage of the dc amplifier circuit or in the circuit constants and device characteristics in the measuring system. This configuration also obviates fine adjustment that would otherwise be needed in the manufacturing stage, thus providing a highly reliable, inexpensive fault detector.

Furthermore, the fault detector of this invention also includes a voltage regulating circuit having its output fed back to the dc amplifier circuit to adjust an output voltage of the dc amplifier circuit, and a third switching circuit inserted between the voltage regulating circuit and the dc amplifier circuit for being operated in synchronism with the second switching circuit. When the second switching circuit is closed, the output of the voltage regulating circuit is fed back to the dc amplifier circuit so as to adjust the output voltage of the dc amplifier circuit to the center value of the input voltage range of the decision circuit. When the first switching circuit is closed, the voltage regulating circuit is disconnected from the dc amplifier circuit while retaining its feedback voltage. This arrangement ensures that the output voltage of the dc amplifier circuit is free from being adversely affected by characteristic variations of devices including those installed in other than the measuring systems. The fault detector therefore is further improved in accuracy and reliability.

What is claimed is:

1. A fault detector for an air bag system comprising:
   a first series circuit having a monitoring resistor and a resistor connected thereto at a first junction;
   a second series circuit having a pair of resistors connected to each other at a second junction, which has the same resistance ratio as that of the first series circuit, for constituting a balanced Wheatstone bridge with the first series circuit as being connected in parallel therewith;
   a dc power source for supplying electric power to the Wheatstone bridge;
   first and second switching circuits connected separately to the first and second junctions for alternative switching;
   a dc amplifier circuit connected to a common output terminal of the first and second switching circuits;
   a voltage regulating circuit having a feedback circuit for feeding back an output thereof to the dc amplifier circuit for adjusting the output voltage of the dc amplifier circuit;
   a third switching circuit interposed between the voltage regulating circuit and the dc amplifier circuit for being operated synchronously with the second switching circuit; and
   a decision circuit to decide whether or not a fault exists in the monitoring resistor based on a difference in output voltages of the dc amplifier circuit, the output voltages of which are fed alternately to the decision circuit in synchronism with the alternative switching of the first and second switching circuits.

2. A fault detector for an air bag system as claimed in claim 1, wherein the dc amplifier circuit has two operational amplifiers and resistors.

3. A fault detector for an air bag system as claimed in claim 1, further including an amplifier interposed between the second junction and a first stage of the dc amplifier circuit for providing a reference voltage thereto.

4. A fault detector for an air bag system as claimed in claim 1, wherein the voltage regulating circuit has an operational amplifier and a capacitor connected between input and output terminals thereof.

5. A fault detector for an air bag system as claimed in claim 1, wherein an output of the voltage regulating circuit is fed back to the dc amplifier circuit.

6. A fault detector for an air bag system as claimed in claim 1, wherein the first, second and third switching circuits are switched by signals produced by the decision circuit.

7. A fault detector for an air bag system as claimed in claim 1, further including an alarm lamp operationally connected to the decision circuit.

8. A fault detector for an air bag system as claimed in claim 1, further including a second Wheatstone bridge consists of a third series circuit having a monitoring resistor and a resistor connected thereto at a third junction, and a fourth series circuit having a pair of resisters connected to each other at a fourth junction.

9. A fault detector for an air bag system as claimed in claim 8, further including a pair of fourth switching circuits for selectively connecting the second junction of the first Wheatstone bridge or the fourth junction of the second Wheatstone bridge to the dc amplifier circuit through an amplifier interposed therebetween for providing a reference voltage.

10. A fault detector for an air bag system as claimed in claim 9, further including a pair of switching circuits connected separately to the third and fourth junctions for alternative switching;
    whereby the third and fourth junctions are connected to the dc amplifier circuit through said pair of switching circuits in stead of the first and second junctions when the fourth junction is connected to the dc amplifier circuit through the interposed amplifier.

11. A fault detector for an air bag system as claimed in claim 10, wherein the first, second, third and fourth switching circuits, and the pair of switching circuits associated with the third and fourth junctions are switched by signals produced by the decision circuit.

* * * * *